United States Patent
Ashokkumar et al.

(10) Patent No.: US 7,518,916 B2
(45) Date of Patent: Apr. 14, 2009

(54) METHOD AND APPARATUS TO PROGRAM BOTH SIDES OF A NON-VOLATILE STATIC RANDOM ACCESS MEMORY

(75) Inventors: Jayant Ashokkumar, Colorado Springs, CO (US); David W. Still, Colorado Springs, CO (US); James D. Allan, Colorado Springs, CO (US); John Roger Gill, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 244 days.

(21) Appl. No.: 11/644,819

(22) Filed: Dec. 22, 2006

(65) Prior Publication Data

US 2008/0151616 A1 Jun. 26, 2008

(51) Int. Cl.
*G11C 16/04* (2006.01)

(52) U.S. Cl. .................................. 365/185.07; 365/154
(58) Field of Classification Search ............ 365/185.07, 365/154, 230.03, 185.28
See application file for complete search history.

(56) References Cited

U.S. PATENT DOCUMENTS

| | | | |
|---|---|---|---|
| 5,914,895 A * | 6/1999 | Jenne | 365/185.08 |
| 6,363,011 B1 * | 3/2002 | Hirose et al. | 365/185.07 |
| 7,110,293 B2 * | 9/2006 | Jung | 365/185.08 |

OTHER PUBLICATIONS

Simtek, nvSRAM Basics, www.simtek.com/attachments/AppNote01.pdf.

* cited by examiner

*Primary Examiner*—Vu A Le

(57) ABSTRACT

A system and method for programming both sides of the non-volatile portion in a semiconductor memory is disclosed. The present invention erases and then programs the memory stacks in the non-volatile portion of an nvSRAM.

3 Claims, 7 Drawing Sheets

METHOD AND APPARATUS TO PROGRAM BOTH SIDES OF A NON-VOLATILE STATIC RANDOM ACCESS MEMORY

BACKGROUND OF THE INVENTION

1. Field of the Invention

The present invention is generally directed to memory, and more particularly to programming both sides of the non-volatile section in a non-volatile Static Random Access Memory (nvSRAM) cell.

2. The Relevant Technology

Semiconductor memory devices are widely used in the computer and electronics industries as a means for retaining digital information. A typical semiconductor memory device is comprised of a large number of memory elements, known as memory cells, that are each capable of storing a single digital bit. The memory cells are arranged into a plurality of separately addressable memory locations, each being capable of storing a predetermined number of digital data bits. All of the memory cells in the device are generally located upon a single semiconductor chip which is contacted and packaged for easy insertion into a computer system.

Currently, it is possible to erase the SONOS transistors on both sides of an nvSRAM cell, however, a method of simultaneously programming both the SONOS transistors is not known. Among the many advantages, simultaneously programming both the SONOS transistors in an nvSRAM can significantly reduce the time needed for endurance testing since both SONOS transistors may be endurance tested at the same time.

BRIEF SUMMARY OF THE INVENTION

In one configuration, a method for programming both non-volatile memory locations in an nvSRAM cell is provided. The non-volatile portion of the nvSRAM cell has a tri-gate structure comprising a recall transistor, a store transistor and a SONOS transistor. The volatile portion has at least an SRAM cell with a word line, a node supplying power to the SRAM cell and a bit line pair with a first bit line and a second bit line. To begin programming, the first and second SONOS transistors associated with the non-volatile portion of the SRAM cell are erased. The first bit line and the second bit lines are grounded as well as the node supplying power to the SRAM cell. A voltage is applied to the word line sufficient to turn the word line to an active state so as to discharge the internal data nodes of the SRAM cell to ground. A voltage is then applied to each store transistor in the first and second tri-gate structures sufficient to turn on each store transistor. Finally, a programming pulse and programming voltage are applied to each SONOS transistor in the first and second tri-gate structures so as to program both tri-gate structures.

In another arrangement, the first and second SONOS transistors associated with the non-volatile portion of the SRAM cell are erased. The volatile portion is isolated from the non-volatile portion by turning off each store transistor in the first and second tri-gate structures. Power is then applied to each recall transistor in the first and second tri-gate structures sufficient to turn on each recall transistor. A programming pulse and programming voltage is then applied to each SONOS transistor in the first and second tri-gate structure so as to program the first and second tri-gate structures in the non-volatile portion of the nvSRAM.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION OF THE PREFERRED EMBODIMENTS

A system and method for programming both sides of the non-volatile portion in a semiconductor memory is disclosed. The present invention erases and then programs the memory stacks in the non-volatile portion of an nvSRAM.

Figure 1:
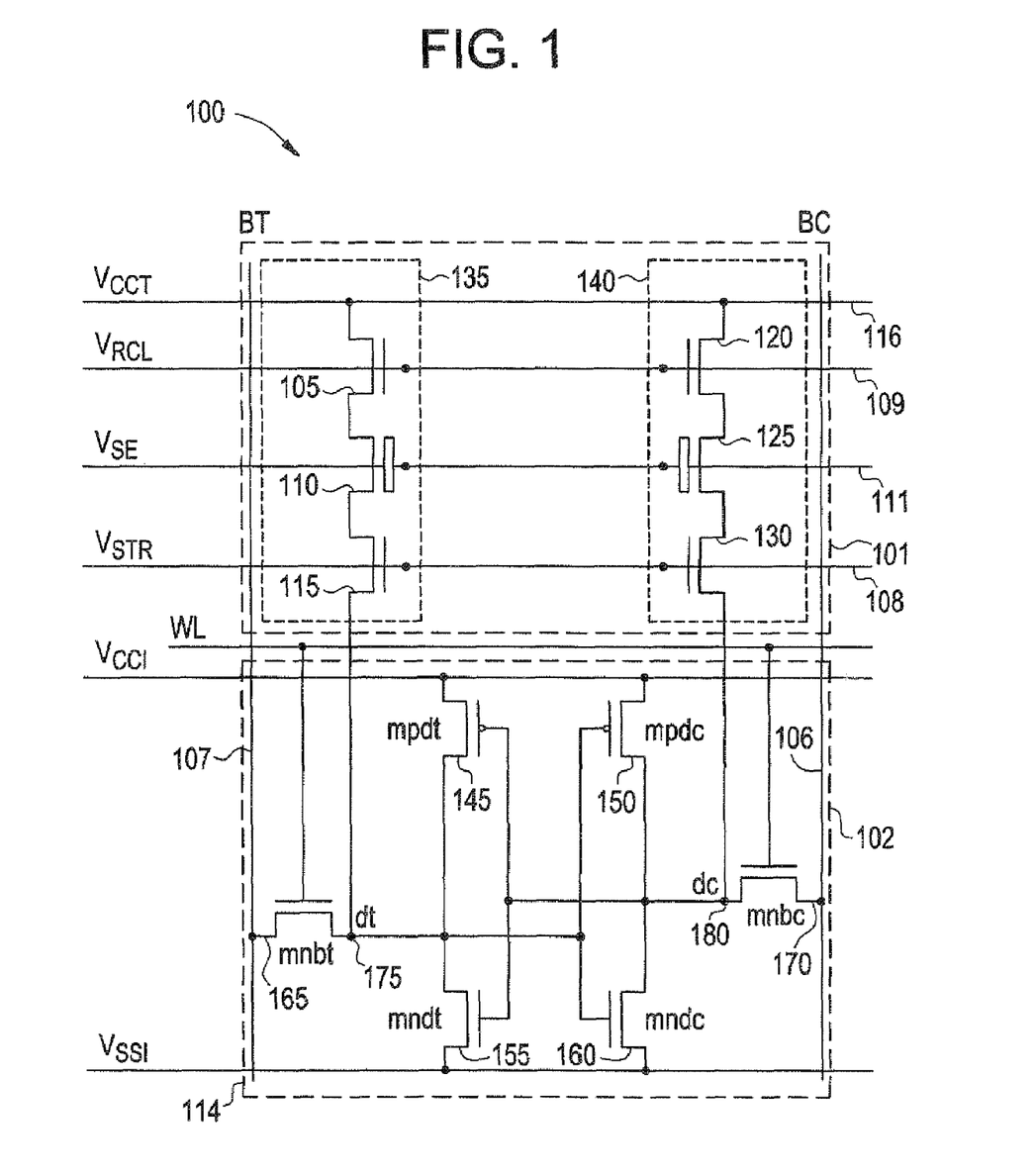
FIG. 1 is a schematic diagram illustrating an nvSRAM memory cell in accordance with one embodiment of the present invention.

FIG. 1 illustrates a typical nvSRAM cell 100 with a single SRAM and a series-connected, non-volatile memory cell, hereinafter referred to as nvSRAM device 100 in accordance with the following invention. While the nvSRAM device 100 is illustrated as having a single nvSRAM memory cell (in this case, the single SRAM and a single non-volatile memory cell), it should be appreciated that an nvSRAM device typically includes a plurality of nvSRAM cells that are integrated with a controller onto a single semiconductor chip to form an array.

A basic nvSRAM cell 100 is comprised of a static random access memory (SRAM) cell 102 that is capable of communicating a bit of data to and from an exterior environment and a non-volatile (nv) cell 101 for providing backup storage to the SRAM cell in the event power is removed from the nvSRAM cell 100. More particularly, the SRAM cell 102 is capable, as long as power is being provided, of receiving a bit of data from an exterior environment, retaining the bit of data, and transmitting the bit of data back to the exterior environment. If, however, power is removed from the SRAM cell 102, the SRAM cell will lose the bit of data. The nv cell 101 prevents loss of the bit of data by providing the capability to receive the bit of data from the SRAM 102, retain the bit of data in the absence of power being provided to the SRAM cell 102, and return the bit of data to the SRAM cell 102 when power is restored. For example, if there is a possibility of power to the SRAM cell 102 being lost, the bit of data can be transferred from the SRAM cell 102 to the nv cell 101 in a store operation. At a later time, the bit of data can be returned from the nv cell 101 to the SRAM cell 102 in a recall operation. The SRAM cell 102 can then transmit the bit of data to the exterior environment, if desired.

Typically, the basic nvSRAM cell 100 is combined with other nvSRAM cells to form a memory array that is integrated onto a single semiconductor chip. Typical nvSRAM memory arrays are comprised of 1,048,576 nvSRAM cells. The motivation for creating integrated semiconductor chips with ever larger arrays of nvSRAM cells is that the area per cell decreases as more cells are integrated onto a chip. For example, four chips, each with arrays of 262,144 nvSRAM cells (an array of 512×512), occupy a greater surface area than a single chip with an array of 1,048,576 nvSRAM cells (an array of 1024×1024). The area occupied by a memory chip is important because many applications for the chip, such as personal computers, are continually attempting to provide more memory in less space.

In the illustrated example, the volatile portion 102 is a six transistor Static Random Access Memory (SRAM) cell. The word static indicates that the memory retains its contents as long as power remains applied. Random access means that locations in the memory can be written to or read from in any order, regardless of the memory location that was accessed last.

SRAM cell 102 typically has three states: standby, writing and reading. In the standby state, the circuit is idle waiting for a read or a write operation to occur. In stand-by mode operation, the word line WL is not asserted and so transistors 165, 170 disconnect the SRAM cell 102 from the bit lines BT 107 and BC 106. The first cross coupled inverter formed by transistors 145, 155 and the second cross coupled inverter formed by transistors 150, 160 continue to reinforce each other and the data remains unchanged.

In the read state, data within SRAM cell 102 is requested. Assume for purposes of explanation that the contents of the memory of SRAM cell 102 is a 1 stored at dt 175 and a 0 stored at dc 180. The read cycles starts by pre-charging both the bit lines to a logical 1, then asserting the word line WL, thereby enabling both transistors 165, 170. The values stored in dt 175 and dc 180 are transferred to the bit lines BT 107 and BC 106 by leaving BT at its pre-charged value and discharging BC through transistor 170 and transistor 160. On the BT side, transistor 165 is cutoff because the VGS on this transistor equals 0V, and thus BT remains pre-charged at logic 1. If, however, the contents of the memory of SRAM cell 102 was a logic 0, the opposite would happen and BC would be pulled towards a logic 1 and BT would discharge through transistor 165 and transistor 155.

In the write state, the contents of SRAM cell 102 is updated. The write cycle begins by applying the value to be written to the bit lines BT 107 and BC 106. Assume, for example, the dt 175 is at a logic level 1 and dc 180 is at a logic level 0. If a logic 0 is desired to be written, then bit line BT 107 is taken to ground while BC 106 is pre-charged to Vcc. Upon asserting the word line, the high node dt 175 inside the SRAM cell 102 gets discharged through transistor 165 to ground and the cell flips its state, thus writing a logic 0 into the cell.

Each bit in an SRAM is stored on four transistors that form two cross-coupled inverters. The storage cell has two stable states, which are used to denote a 0 and a 1. Two additional transistors serve to control access to a storage cell during read and write operations. Accordingly, six transistors store one memory bit.

Access to each cell is enabled by the word line (WL) 121 that controls the two transistors 165, 170. Transistors 165, 170 control whether the cell should be connected to the bit lines BT 107 and BC 106. Transistors 165, 170 are also used to transfer data for both the read and write operations. Two bit lines BT and BC are not required, however, both the true signal and the compliment of that signal provide improved noise margins.

Generally, as illustrated in FIG. 1, nvSRAM cell 100 comprises a plurality of n-channel, Field-Effect Transistors (FETs); a plurality of nonvolatile elements, such as nonvolatile transistors or capacitors; and a plurality of resistors. It should, however, be appreciated that other types of transistors, such as p-channel FETs, and combinations of different types of transistors can be utilized.

As shown in FIG. 1, transistor mpdt 145 and mndt 155 form the first inverter and transistors mndc 160 and mpdc 150 form the second inverter. The output of the first inverter dt 175 is coupled to the input of the second inverter and the output of the second inverter dc 180 is coupled to the input of the first inverter. The configuration of the first and second inverters form the latch in the SRAM cell 102. There are two pass transistors 165, 170 that are driven by the signal WL 121. The first pass transistor mnbt 165 connects the bit line BT 107 to the data true node 175 and the second pass transistor mnbc 170 connects the bit-line complement BC 106 to the data complement node dc 180.

The nonvolatile portion 101 includes a first silicon oxide nitride oxide semiconductor (SONOS) FET 110 and a second SONOS FET 125 for respectively storing the state of the SRAM cell 102. The state of SRAM cell 102 is stored in the first and second SONOS FETs 110, 125 by performing a store operation. This is accomplished by applying a high voltage on $V_{SE}$ signal applied to the gates of SONOS FETs 110, 125. It should be appreciated that the SONOS FETs 110, 125 can be replaced with other types of nonvolatile storage elements, such as silicon nitride oxide semiconductor (SNOS) transistors, floating gate transistors, ferroelectric transistors, and capacitors to name a few.

The nonvolatile portion 101 further includes a first store FET 115 and a second store FET 130 that operate as switches during store and recall operations to appropriately configure the nonvolatile portion 101 for the transfer of a bit of data between the volatile portion 102 and the nonvolatile portion 101. More specifically, the first and second store FETs 115, 130 function to connect the nonvolatile portion 101 to the volatile portion 102 during store and recall operations and to otherwise disconnect the nonvolatile portion 101 from the volatile portion 102. The state of the first and second store FETs 115, 130 is controlled by a $V_{STR}$ signal that is applied to the gates of the FETs. More specifically, if the $V_{STR}$ signal is LOW, the first and second store FETs 115, 130 are turned OFF to disconnect the nonvolatile portion 101 from the volatile portion 102. Conversely, if the $V_{STR}$ signal is HIGH, the first and second store FETs 115, 130 are turned ON to connect the nonvolatile portion 101 to the volatile portion 102. Typically, a LOW signal is approximately 0V and a HIGH signal is approximately 1.8V.

The nonvolatile portion 101 further includes a first recall FET 105 and a second recall FET 120 that also function as switches to place the nonvolatile portion 101 in the appropriate configuration for transferring a bit of data between the volatile portion 102 and the nonvolatile portion 101 during store and recall operations. More specifically, the first and second recall FETs 105, 120 function to connect the nonvolatile portion 101 to $V_{CCT}$ during a recall operation and to disconnect the nonvolatile portion 101 from the $V_{CCT}$ during a store operation and otherwise. The first and second recall transistors 105, 120 are turned OFF during a store operation. The state of the first and second recall FETs 105, 120 is controlled by a $V_{RCL}$ signal that is applied to the gates of the FETs. More specifically, if the $V_{RCL}$ signal is LOW, the first and second recall FETs 105, 120 are turned OFF to disconnect the nonvolatile portion 101 from $V_{CCT}$. Conversely, if the $V_{RCL}$ signal is HIGH, the first and second recall FETs 105, 120 are turned ON to connect the nonvolatile portion 101 to $V_{CCT}$. In a preferred embodiment of the present invention, the control signals on the $V_{RCL}$, $V_{SE}$, $V_{STR}$ and word lines WL are provided by a device control unit (illustrated in FIG. 2).

Figure 2:
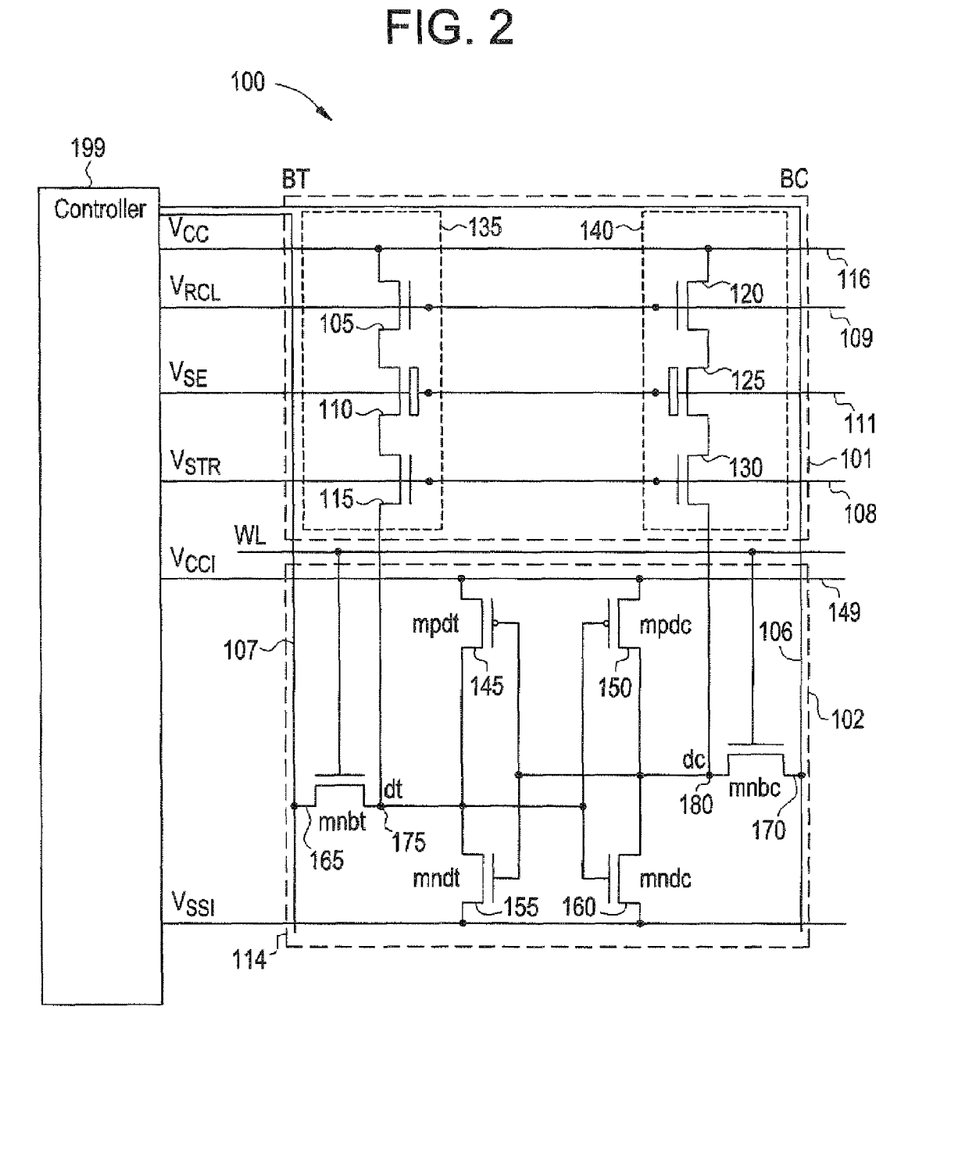
FIG. 2 is a schematic diagram illustrating an nvSRAM memory cell of FIG. 1 with an attached controller.

As illustrated in FIG. 2, a controller 199 is included in the nvSRAM device 100 for (1) providing signals to SRAM cell 102 to transfer a bit of data between the SRAM cell 102 and the exterior environment; (2) providing signals to the SRAM cell 102 and the non-volatile portion 101 to copy a bit of data from the SRAM cell 102 into the non-volatile portion 101, i.e., cause a store operation to be performed; and (3) providing signals to the SRAM cell 102 and the non-volatile portion 101 to copy a bit of data from the non-volatile portion 101 to the SRAM cell 102, i.e., cause a recall operation to be performed. The controller 199 performs the noted operations based upon signals received from a device, typically a microprocessor, that is located exterior to the nvSRAM device 100. For example, if a microprocessor required the bit of data stored in the SRAM 102, it would issue a command to the controller 199. In response, the controller 199 would provide the signals to the SRAM cell 102 to cause the bit of data in the SRAM cell 102 to be transferred to the exterior environment. The microprocessor can also request a store or recall operation performed on the non-volatile memory cells in the non-volatile portion 101.

The controller also performs certain operations without direction from a microprocessor. For instance, the controller 199 is capable of independently sensing when power is initially being applied to the device 100 and, in response, causing a recall operation (power-up recall operation) to be performed with respect to one of the non-volatile memory cells in the non-volatile portion 101. Conversely, the controller 199 is capable of sensing when power is being removed from the device 100 and, in response, causing a store operation (power-down store operation) to be performed with respect to one of the non-volatile memory cells in the non-volatile portion 101. The non-volatile memory cell in the non-volatile portion 101 to which the bit of data in the SRAM cell 102 is transferred in the case of a power-down and the non-volatile memory cell in the non-volatile portion 101 from which a bit of data is recalled in the event of a power-up is established in the nvSRAM 100 during manufacture. Alternatively, the nvSRAM 100 is designed to allow the user to configure stores or recalls on the non-volatile memory cells. This configurability can be achieved via a command that is issued to the nvSRAM 100 or any of the other ways known in the art.

It should be appreciated that other nonvolatile configurations are possible to achieve the functions of the nonvolatile portion 101 of the cell 100 and the invention is in no way limited to the particular configuration illustrated in FIG. 1. The particular configuration utilized in any application will depend upon both technological and performance criteria.

During normal SRAM cell operation, node $V_{STR}$ is held low which disconnects the nonvolatile section 101 of the nvSRAM cell from the volatile section 102. In other words, there is typically no communication between volatile section 102 and nonvolatile section 101 of the memory cell 100. The volatile section 102 of memory cell 100 is accessed in the following manner. The word line, WL 121, is raised to approximately 1.8V to turn on the pass transistor gates 165, 170 and the data is read or written differentially through the bit lines, BT 107 and BC 106. The transfer of data from the volatile section 102 to the non-volatile section 101, i.e. a STORE operation, takes place in two steps, during which the word line, WL 121, is OFF or at 0V (i.e., ground).

During the first step, the erase portion of the STORE cycle, nonvolatile control lines $V_{STR}$ 108 and $V_{RCL}$ 109 remain low or OFF, which is typically 0V. Then, non-volatile transistor gate of SONOS transistors 110, 125 is pumped down to a negative super voltage through node $V_{SE}$ 111 sufficient to positively charge the nitride dielectric through direct tunneling across the ultra thin tunnel oxide. In a typical arrangement, the negative super voltage is approximately equal to −10V. Node $V_{SE}$ 111 is held at the negative super voltage long enough to convert all the threshold voltages, $V_T$, of all the nitride transistors in the array to equal depletion values. The erase portion of the STORE cycle is completed by discharging $V_{SE}$ back to ground.

To program the non-volatile SRAM from the data in the volatile SRAM, assuming that the last SRAM write has left a logic "1," which leaves the data true node of the SRAM cell at 1.8V and the data complement node at a logic level 0. With the word line 121 to the SRAM cell 102 at ground, and the bit line pairs BT 107 and BC 106 maintained at 1.8V, the VSTR signal that gates the first and second store transistors is turned ON by raising VSTR to 1.8V. Next, a programming pulse and programming voltage of approximately 10V is applied on VSE, which gates the first and second SONOS transistors. The store transistor with its gate and source voltage both at 1.8V is cutoff, while the store transistor with its gate voltage 1.8V and its source voltage at 0V is ON and puts the 0V on the source node of the SONOS transistor on the dc side of the SRAM cell. This SONOS transistor gets programmed as electrons tunnel into the nitride and get stored, thus raising the threshold voltage of the SONOS transistor on the dc side of the SRAM cell. The SONOS transistor on the dt side of the SRAM cell stays erased as its source and drain node couple up with the VSE voltage. Thus, a depletion transistor and an enhancement mode transistor are formed on both sides of the trigate.

The RECALL cycle begins by clearing the existing SRAM data, first by discharging the bit lines, BT 107 and BC 106, clamping VCCI to VSSI and then by turning on the word line, WL 121. With word line 121 ON and the bit lines BT 107 and BC 106 at ground, the data nodes dt 175 and dc 180 are discharged to ground. The word line 121 is then returned to ground. Both nodes $V_{STR}$ and $V_{RCL}$ are turned on, providing a charging path to the internal nodes of the volatile section 102 through the nonvolatile section 101 to the power supply. With nonvolatile gate, $V_{SE}$, held at ground and assuming the last STORE operation left SONOS transistor 110 erased and SONOS transistor 125 programmed, and assuming that the erase threshold is −1V and the program threshold is +1V, the SONOS transistor 110 will conduct current while the SONOS transistor 125 will not because its gate voltage is below its VT. Node dt 175 charges up high, while node dc 180 remains low, thereby reestablishing the data corresponding to the last STORE cycle as explained above. The RECALL operation is completed by powering up the SRAM and returning all control lines to their default states.

Figure 3:
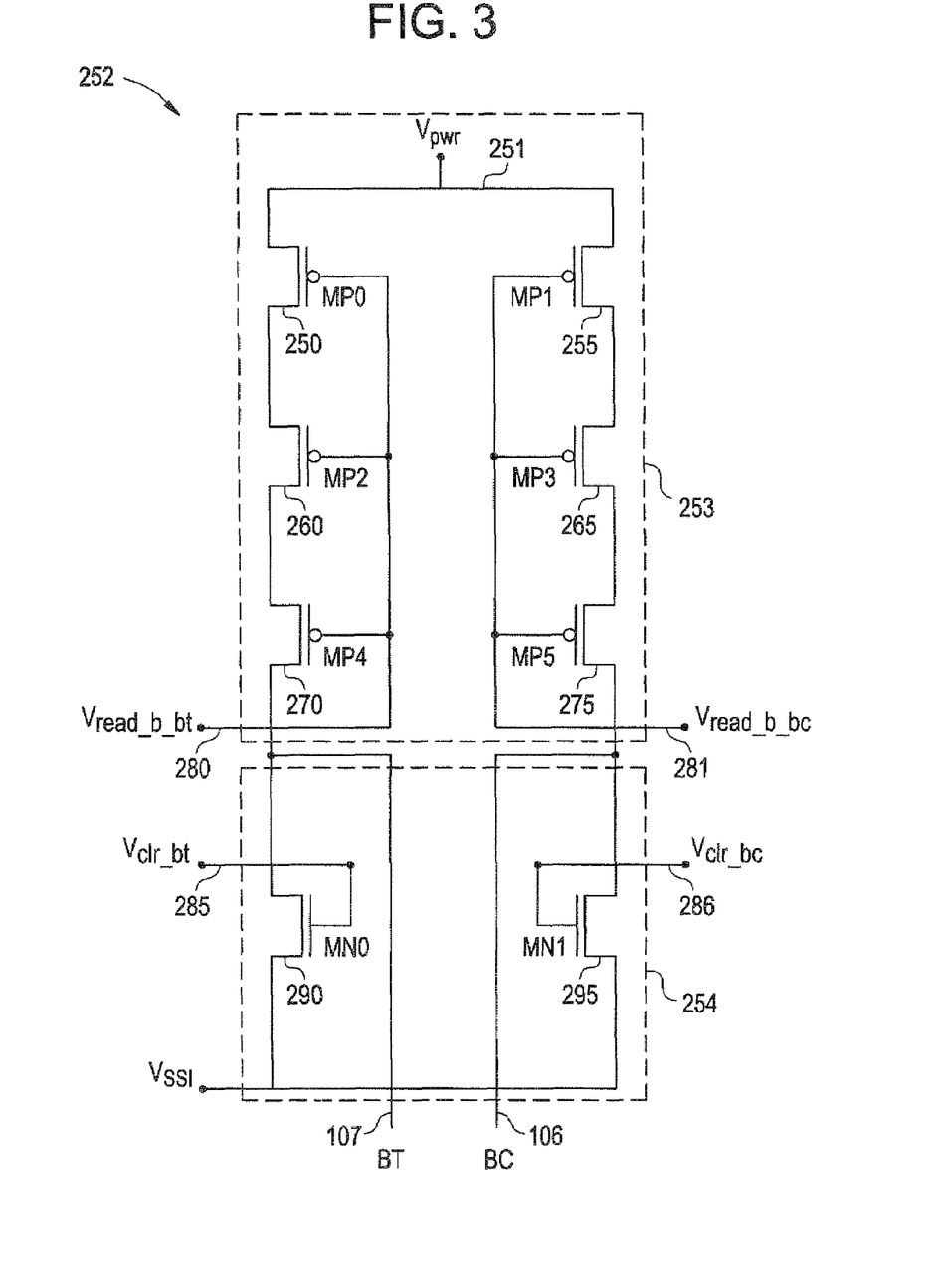
FIG. 3 is a schematic diagram illustrating array reset circuit for independently applying a voltage to each of the bit lines in a bit line pair as well as independently grounding the bit lines in the bit line pair.

In accordance with the present invention, FIG. 3 illustrates an array reset circuit 252 for controlling each bit line in a bit line pair. Array reset circuit 252 is capable of independently operating bit lines BT 107 and BC 106. In other words, array reset circuit 252 may independently drive the state of bit line BT 107 either HIGH or LOW—which in the present invention is 1.8V or 0.0V respectively—without regards for the state of bit line BC 106. At the same time, bit line BC 106 may be driven HIGH or LOW, and the state of bit line BT 107 has no effect.

Array reset circuit 252 is comprised of a first circuit portion 253 and a second circuit portion 254. First circuit portion 253 has a first plurality of series connected p-channel transistors 250, 260, 270 and a second plurality of series connected p-channel transistors 255, 265, 275 that act as a load for the bit lines BT 107 and BC 106 respectively. The sources of transistor 250 and transistor 255 are connected to a power source $V_{PWR}$ 251. The drains of transistors 270 and transistor 275 are connected to the BT 107 and BC 106 respectively and keep the bit-lines pre-charged to VPWR 251. The gates of transistors 250, 260, 270 are connected together and coupled to node $V_{read\_b\_bt}$. The gates of transistors 255, 265, 275 are connected together and coupled to node $V_{read\_b\_bc}$. Second circuit portion 254 has a first n-channel transistor 290 and a second n-channel transistor 295 that couple the bit lines BT 107 and BC 106 to ground node $V_{SSI}$. The gate of transistor 290 is coupled to $V_{clr\_bt}$, the source is connected to ground node $V_{SSI}$, and the drain is coupled to BT 107. The gate of transistor 295 is coupled to $V_{clr\_bc}$, the source is connected to ground node $V_{SSI}$ and the drain is coupled to BC 106.

In an operation for grounding and energizing the bit lines, $V_{CCI}$ and $V_{SSI}$ in memory cell 100 are clamped close to chip ground $V_{SS}$ (not shown). During normal SRAM operation, $V_{read\_b\_bt}$ and $V_{read\_b\_bc}$ are held at ground (0V) and $V_{clr\_bt}$ and $V_{clr\_bc}$ are held at 0V, thus enabling the bit-lines to be pre-charged to VPWR 251. A single bit line, for purposes of illustration bit line BC 106, may be driven LOW or to chip ground. Accordingly, $V_{read\_b\_bc}$ 281 and $V_{clr\_bc}$ 286 are maintained HIGH and $V_{read\_b\_bt}$ 280 and $V_{clr\_bt}$ 285 are maintained LOW. Driving $V_{read\_b\_bc}$ 281 and $V_{clr\_bc}$ 286 HIGH turns OFF the series connected p-channel transistors 255, 265, 275 and turns the n-channel transistor 295 to an ON state. Accordingly, bit line BC 106 is connected to ground node $V_{SSI}$ and thus driven LOW to chip ground. Driving $V_{read\_b\_bt}$ 280 and $V_{clr\_bt}$ 285 LOW turns ON the series connected p-channel transistors 250, 260, 270 and turns the n-channel transistor 290 OFF. The series connected p-channel transistors become a load for bit Line BT 107 and thus energize BT 107 to a HIGH state.

Figure 4:
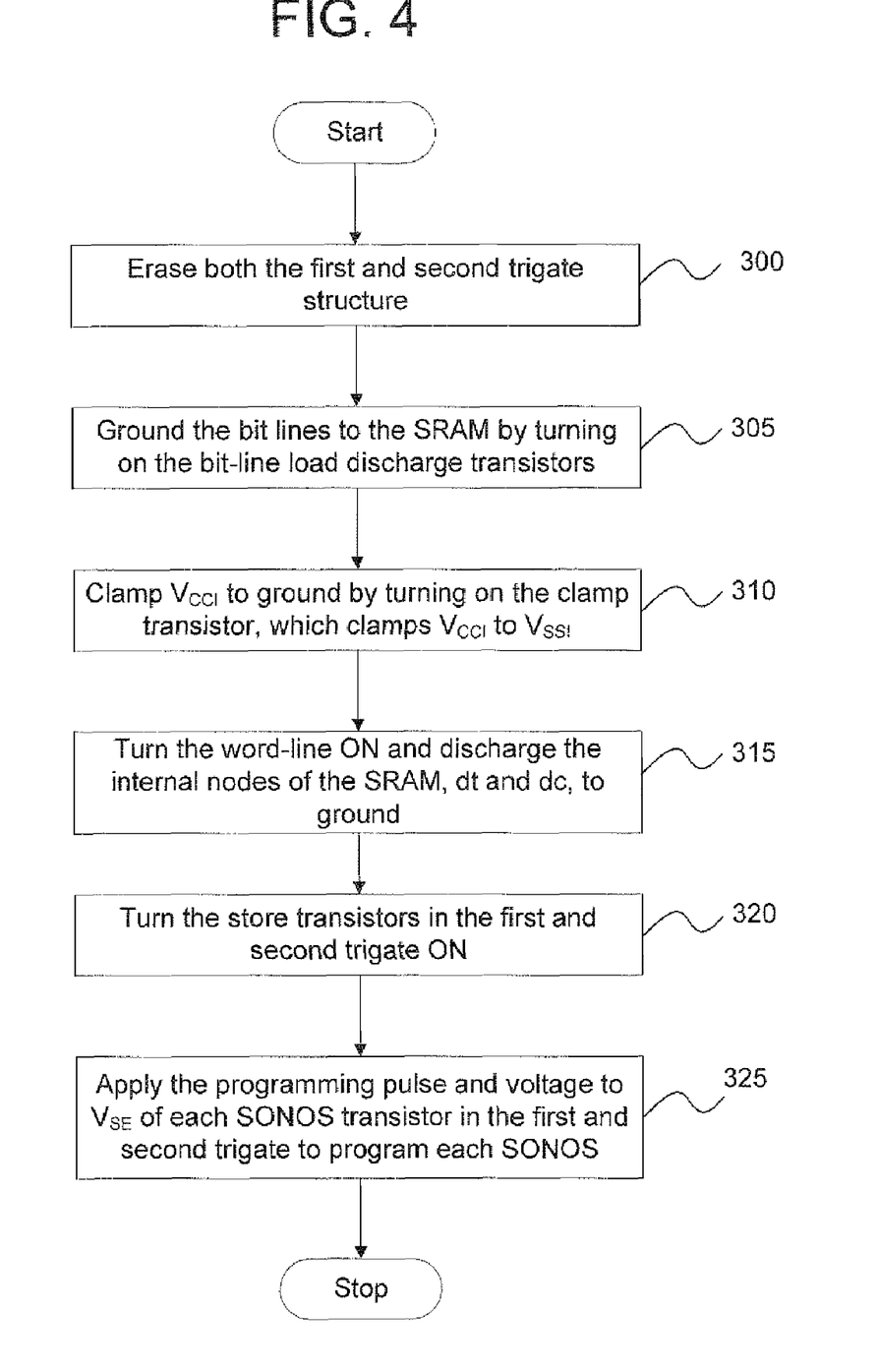
FIG. 4 is flow chart illustrating one embodiment of the present invention.

FIG. 4 illustrates, via flow chart, a typical procedure for programming the SONOS transistors 110, 125 in tri-gate structures 135, 140. The method illustrated in FIG. 4 will also be described with reference to the schematic diagrams of the nvSRAM and array reset circuit shown in FIGS. 2 and 3 respectively. As shown in step 300, both the SONOS FETs 110, 125 in the first trigate structure 135 and the second trigate structure 140 are erased. A typical method of erasing the SONOS transistors 110, 125 in the first and second trigate structures is as follows. The supply voltage $V_{CCT}$ 116 is energized to a HIGH condition, for example 1.8V. The recall transistors 105, 120 and the store transistors 115, 130 in the first and second trigate structures 135, 140 are maintained in an OFF condition. Typically, to turn OFF the store and recall transistors, $V_{RCL}$ and $V_{STR}$ are driven to approximately ground or 0V. A negative erase pulse and erase voltage is applied to the $V_{SE}$ node, typically around −10V for 10 ms, for the SONOS transistors 110, 125 in the first and second trigate structures 135, 140. The SONOS transistors 110, 125 in the first and second trigates 135, 140 are erased.

The bit line lines BT 107 and BC 106 are grounded in step 305 by turning on the bit line load discharge transistors illustrated and described with respect to the array reset circuit 252 in FIG. 3. Typically, as described above, $V_{CCI}$ and $V_{SSI}$ in memory cell 100 are clamped close to chip ground $V_{SS}$. Both bit lines BC 106 and BT 107 are to be driven LOW or to chip ground. Accordingly, $V_{read\_b\_bc}$ 281, $V_{read\_b\_bt}$ 280, $V_{clr\_bc}$ 286 and $V_{clr\_bt}$ 285 are maintained HIGH. Driving $V_{read\_b\_bc}$ 281 and $V_{clr\_bc}$ 286 HIGH turns OFF the series connected p-channel transistors 255, 265, 275 and turns the n-channel transistor 295 to an ON state. Driving $V_{read\_b\_bt}$ 280 and $V_{clr\_bt}$ 285 HIGH turns OFF the series connected p-channel transistors 250, 260, 270 and turns the n-channel transistor 290 to an ON state. Accordingly, bit lines BC 106 and BT 107 are connected to ground node $V_{SSI}$ and thus driven LOW to chip ground.

Figure 8:
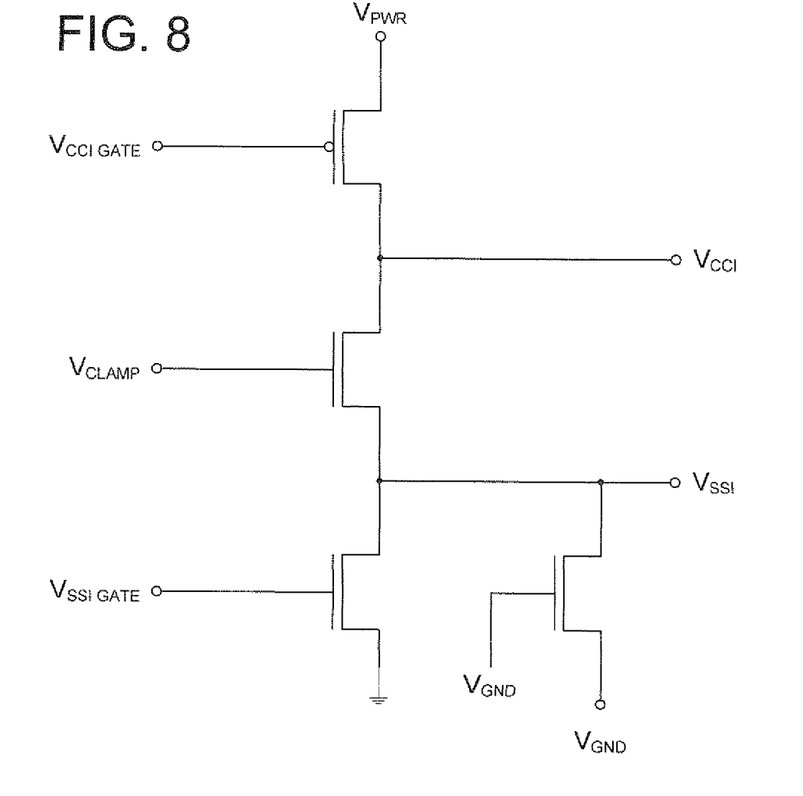
FIG. 8 illustrates the clamp transistor that operates to clamp $V_{CCI}$ to $V_{SSI}$.

$V_{CCI}$ 149 is then clamped to $V_{SSI}$ 114 in step 310 by turning on the clamp transistor shown in FIG. 8, which operates to clamp $V_{CCI}$ to $V_{SSI}$. In step 315, the word line is energized or turned ON so as to discharge the internal nodes dt 175 and dc 180 of the SRAM portion 102 to ground. The store transistors 115, 130 in the first and second trigates 135, 140 are turned ON in step 320 by applying a suitable voltage to $V_{STR}$, which is typically 1.8V. A programming pulse and programming voltage are then applied on $V_{SE}$ node 111 connected to the gates of the SONOS transistors 110, 125 in the first and second trigate 135, 140 in step 325 so as to program each of the SONOS transistors. Since dt 175 and dc 180 are both LOW, the SONOS transistors 110, 125 are both programmed in accordance with the description above.

Figure 5:
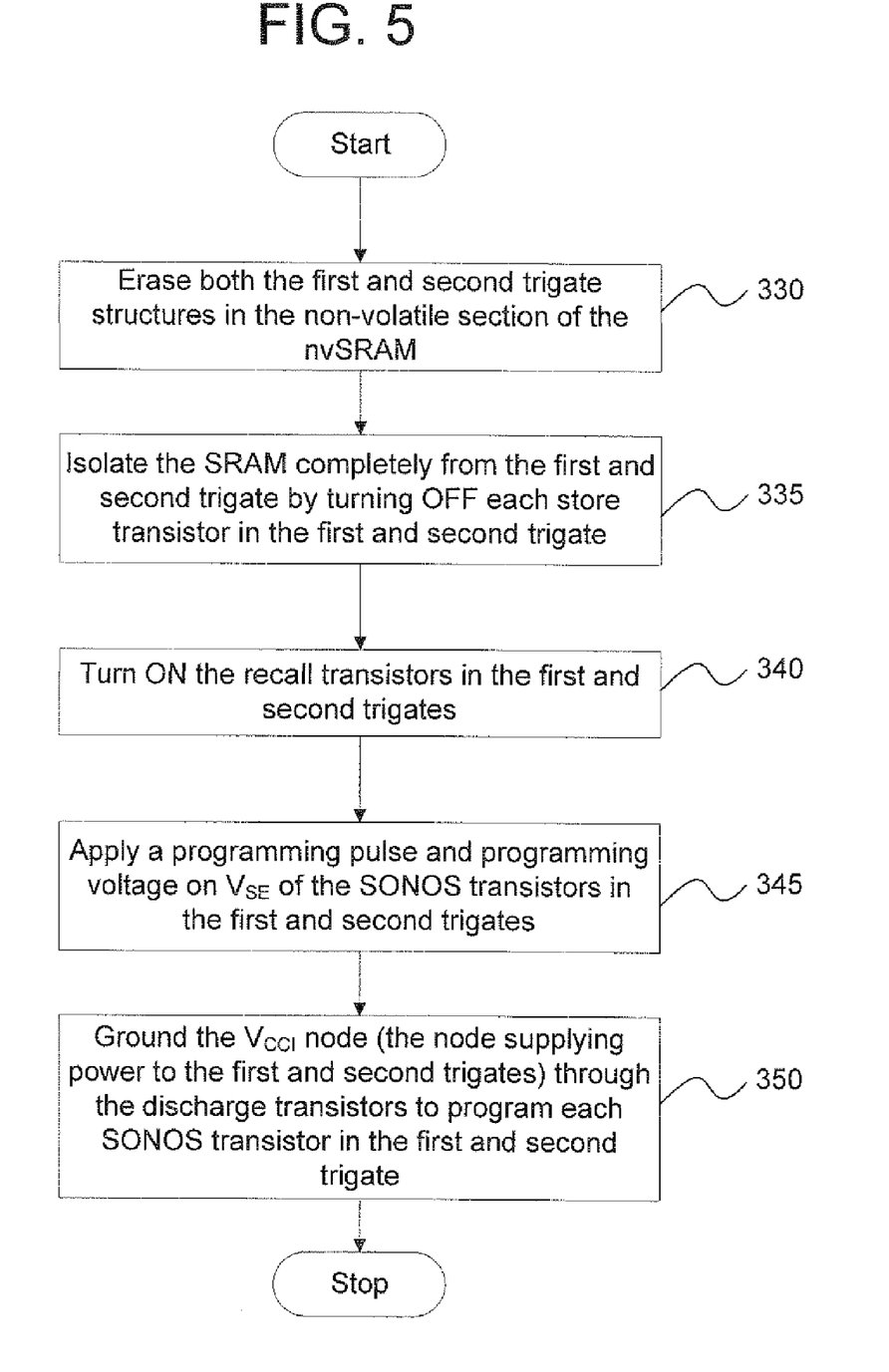
FIG. 5 is flow chart illustrating another embodiment of the present invention.

FIG. 5 shows an alternate embodiment of the present invention for programming the SONOS transistors 110, 125 in tri-gate structures 135, 140. As with FIG. 4, the method illustrated in FIG. 5 will also be described with reference to the schematic diagrams of the nvSRAM and array reset circuit shown in FIGS. 2 and 3 respectively. As shown in step 330, both the first SONOS transistor 110 in the trigate structure 135 and the second SONOS transistor 125 in the trigate structure 140 are erased. A typical method of erasing the SONOS transistors 110, 125 in the first and second trigate structures 135, 140 is described above. To summarize a typical erase procedure, the supply voltage $V_{CCT}$ 116 is energized to a HIGH condition. The recall transistors 105, 120 and the store transistors 115, 130 in the first and second trigate structures 135, 140 are maintained in an OFF condition. A negative erase pulse is applied to the $V_{SE}$ node for the SONOS transistors 110, 125 in the first and second trigate structures 135, 140 to erase the SONOS transistors.

Figure 9:
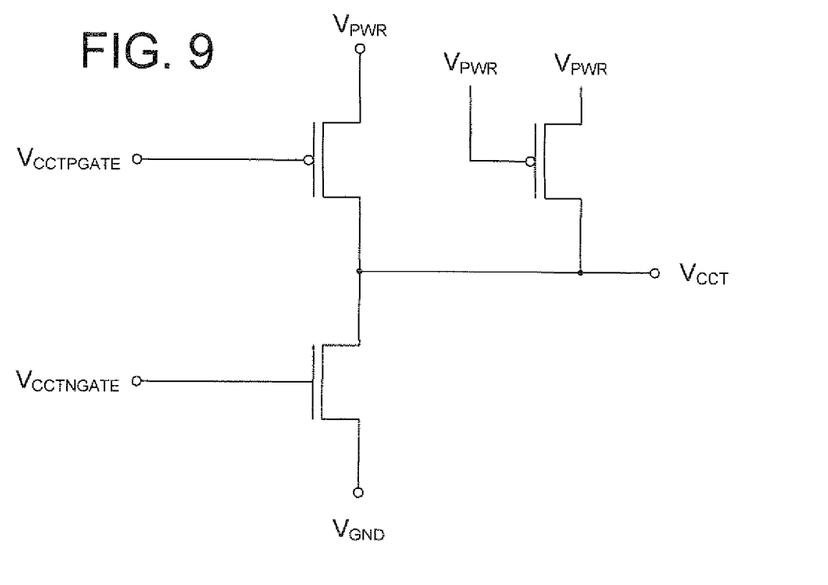
FIG. 9 illustrates a discharge transistor for grounding the $V_{CCT}$ node.

The SRAM portion 102 is isolated from the first and second trigate structures 135, 140 in non-volatile portion 101 in step 335 by turning OFF the store transistors 115, 130. Typically, store transistors 115, 130 are turned OFF by maintaining approximately 0V (or grounding) on the $V_{STR}$ node coupled to the gate of each store transistor. In step 340, the recall transistors 105, 120 are turned ON by typically applying a voltage to $V_{RCL}$ coupled to the gates of the recall transistors. A programming pulse and programming voltage are then applied in step 345 to the $V_{SE}$ node 111 coupled to the gates of the SONOS transistors 110, 125 in the first and second trigates 135, 140. As shown in step 350, the VCCT node 116 is grounded through discharge transistors shown in FIG. 9, which operates to program the SONOS transistors 110, 125 in the first and second trigate structures 135, 140.

Figure 6:
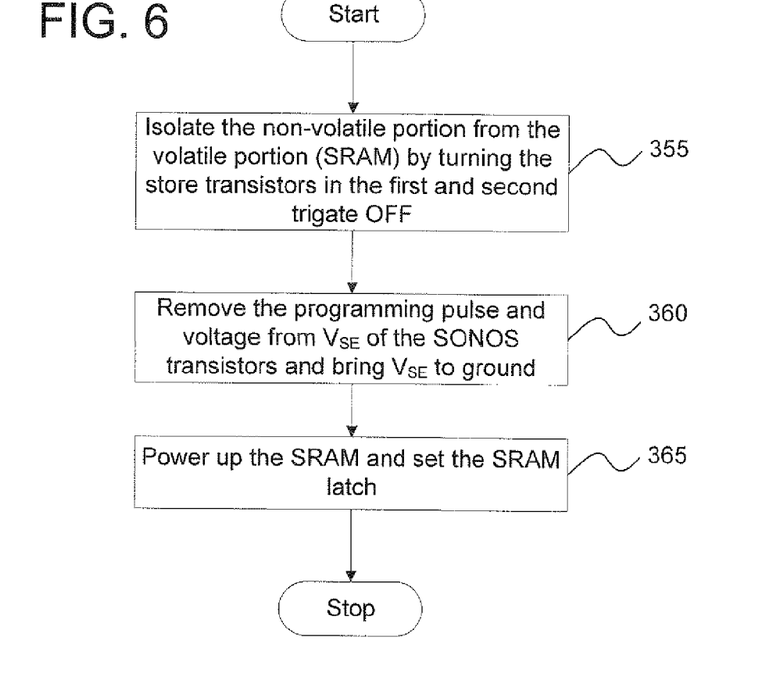
FIG. 6 is flow chart illustrating turning of the trigate structure at the conclusion of a programming procedure illustrated in FIG. 4.

One particular method of turning off the trigate structure at the conclusion of a programming procedure illustrated in FIG. 4 is illustrated and described with respect to FIG. 6. The SRAM portion 102 is isolated from the first and second trigate structures 135, 140 in non-volatile portion 101 in step 355 by turning OFF the store transistors 115, 130. Typically, store transistors 115, 130 are turned OFF by maintaining approximately 0V (or grounding) on the $V_{STR}$ node coupled to the gate of each store transistor. In step 360, the programming pulse and programming voltage are removed from the $V_{SE}$ node 111 coupled to the gates of the SONOS transistors 110, 125 and the $V_{SE}$ node 111 is brought to ground. The SRAM portion is powered up in step 365 and the SRAM latch is set, and all the nodes are brought back to their default state.

Figure 7:
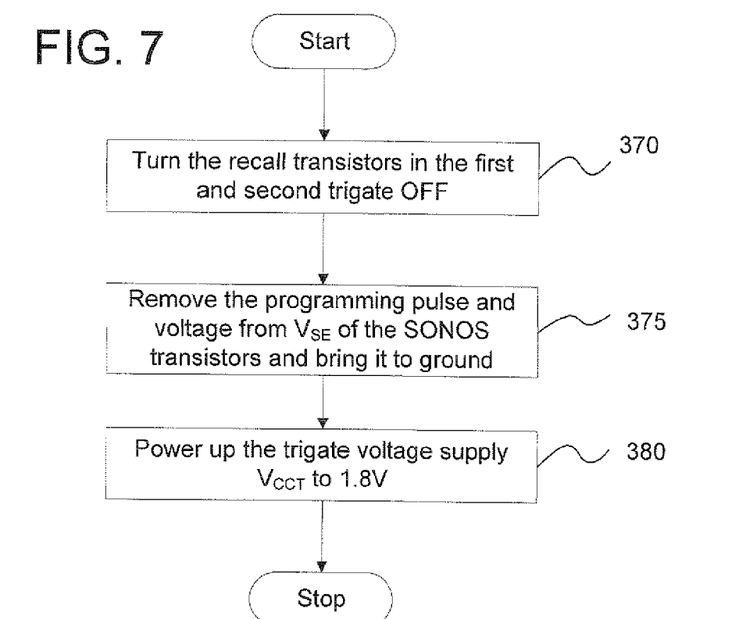
FIG. 7 is flow chart illustrating turning of the trigate structure at the conclusion of a programming procedure illustrated in FIG. 5.

A method of turning of the trigate structure at the conclusion of a programming procedure illustrated in FIG. 5 is illustrated and described with respect to FIG. 7. The recall transistors 105, 120 are turned OFF in step 370 by removing the voltage from $V_{RCL}$. In step 375, the programming pulse and programming voltage are removed from the $V_{SE}$ node 111 coupled to the gates of the SONOS transistors 110, 125 and the $V_{SE}$ node 111 is brought to ground. The power supply $V_{CCT}$ is powered up in step 380, typically to 1.8V.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

We claim:

1. A method for programming a first and second tri-gate structure in a non-volatile SRAM cell having a volatile portion and a non-volatile portion, each tri-gate structure in said non-volatile portion having a recall transistor, a store transistor and a SONOS transistor, said volatile portion having an SRAM cell comprising a word line, a node supplying power to said SRAM cell and a bit line pair with a first bit line and a second bit line, said method comprising:

erasing said first and second SONOS transistors associated with said non-volatile portion of said SRAM cell;
   grounding said first bit line and said second bit line;
   grounding said node supplying power to said SRAM cell;
   applying a voltage to said word line sufficient to turn the word line to an active state so as to discharge said internal data nodes of said SRAM cell to ground;
   applying a voltage to each store transistor in said first and second tri-gate structure sufficient to turn each store transistor on; and
   applying a programming pulse and programming voltage to each SONOS transistor in said first and second tri-gate structure to program said tri-gate structure in said non-volatile portion.

2. The method of claim 1 wherein said grounding of said first and second bit line further comprises grounding said first bit line of said bit line pair independent of said second bit line of said bit line pair using an array reset circuit.

3. A method for programming a first and second tri-gate structure in a non-volatile SRAM cell having a volatile portion and a non-volatile portion, each tri-gate structure in said non-volatile portion having a recall transistor, a store transistor and a SONOS transistor, said volatile portion having an SRAM cell comprising a word line, a node supplying power to said SRAM cell and a bit line pair with a first bit line and a second bit line, said method comprising:

erasing said first and second SONOS transistors associated with said non-volatile portion of said SRAM cell;
   isolating said volatile portion from said non-volatile portion by turning off each store transistor in said first and second tri-gate structure;
   applying power to each recall transistor in said first and second tri-gate structure sufficient to turn said each recall transistor on; and
   applying a programming pulse and programming voltage to each SONOS transistor in said first and second tri-gate structure to program said tri-gate structure in said non-volatile portion.

\* \* \* \* \*